(12) United States Patent
Own et al.

(10) Patent No.: US 8,921,787 B2
(45) Date of Patent: Dec. 30, 2014

(54) INCOHERENT TRANSMISSION ELECTRON MICROSCOPY

(71) Applicants: Christopher Su-Yan Own, Seattle, WA (US); William Andregg, Woodside, CA (US); Mochii, Inc., Seattle, WA (US)

(72) Inventors: Christopher Su-Yan Own, Seattle, WA (US); Andrew Bleloch, Chorley (GB); William Andregg, Woodside, CA (US)

(73) Assignee: Mochii, Inc., Seattle, WA (US)

( * ) Notice: Subject to any disclaimer, the term of this patent is extended or adjusted under 35 U.S.C. 154(b) by 0 days.

(21) Appl. No.: 14/258,004

(22) Filed: Apr. 21, 2014

(65) Prior Publication Data

US 2014/0284475 A1    Sep. 25, 2014

Related U.S. Application Data

(63) Continuation of application No. 13/759,029, filed on Feb. 4, 2013, now Pat. No. 8,748,818, which is a continuation of application No. 13/155,303, filed on Jun. 7, 2011, now Pat. No. 8,389,937, which is a continuation-in-part of application No. 13/024,961, filed on Feb. 10, 2011, now Pat. No. 8,324,574.

(60) Provisional application No. 61/352,243, filed on Jun. 7, 2010, provisional application No. 61/303,260, filed on Feb. 10, 2010.

(51) Int. Cl.
*G01N 23/02* (2006.01)
*G01N 13/12* (2006.01)
*H01J 37/26* (2006.01)

(52) U.S. Cl.
CPC .................................... *H01J 37/263* (2013.01)
USPC ........... 250/311; 250/310; 250/306; 250/307; 250/396 R; 250/397; 250/492.3; 315/111.81

(58) Field of Classification Search
CPC ....... H01J 37/153; H01J 37/26; H01J 37/261; G01N 23/02
USPC ............. 250/311, 310, 306, 307, 396 R, 397, 250/492.3; 315/111.81
See application file for complete search history.

(56) References Cited

U.S. PATENT DOCUMENTS 8,324,574 B2 * 12/2012 Own et al. .................... 250/311
8,389,937 B2 *  3/2013 Own et al. .................... 250/311
8,468,189 B2 *  6/2013 Oktem et al. ................. 708/446
8,748,818 B2 *  6/2014 Own et al. .................... 250/311

* cited by examiner

*Primary Examiner* — Nikita Wells
(74) *Attorney, Agent, or Firm* — Mei & Mark LLP

(57) ABSTRACT

A transmission electron microscope includes an electron beam source to generate an electron beam. Beam optics are provided to converge the electron beam. A specimen holder is provided to hold a specimen in the path of the electron beam. A detector is used to detect the electron beam transmitted through the specimen. The transmission electron microscope may be adapted to generate two or more images that are substantially incoherently related to one another, store the images, and combine amplitude signals at corresponding pixels of the respective images to improve a signal-to-noise ratio. Alternatively or in addition, the transmission electron microscope may be adapted to operate the specimen holder to move the specimen in relation to the beam optics during exposure or between exposures to operate the transmission electron microscope in an incoherent mode.

8 Claims, 18 Drawing Sheets

Projection of Back Focal Plane in Two Dimensions

Projection of Back Focal
Plane in Two Dimensions

US 8,921,787 B2

INCOHERENT TRANSMISSION ELECTRON MICROSCOPY

CLAIM FOR PRIORITY

This application is a continuation of application Ser. No. 13/759,029, filed Feb. 4, 2013, which is a continuation of U.S. Pat. No. 8,389,937, filed Jun. 7, 2011, which claims priority under 35 U.S.C. §119(e) to Provisional Application No. 61/352,243, filed Jun. 7, 2010, and is a continuation-in-part of U.S. patent application Ser. No. 13/024,961, filed Feb. 10, 2011, which claims priority under 35 U.S.C. §119(e) to Provisional Application No. 61/303,260, filed Feb. 10, 2010, and Provisional Application No. 61/352,243, filed Jun. 7, 2010, all of which are incorporated herein by reference in their entireties.

TECHNICAL FIELD

This application relates to incoherent electron microscopy.

BACKGROUND

There are applications in which it is desirable to use electron microscopy to resolve a single point-like object in a specimen. The single point-like object may be, for example, a single atom or a cluster of atoms on an amorphous substrate. Electron microscopy could theoretically be used to sequence bases of a nucleic acid, for example, such as the bases of a strand of deoxyribonucleic acid (DNA).

Scanning transmission electron microscopy (STEM), which raster scans an electron beam across a specimen, can be used to resolve single point-like objects in an image. However, STEM typically suffers from a slow scanning time, which causes poor throughput. For example, STEM may involve scanning for a time on the order of 1 µs to 10 µs per pixel of the image. This scanning time may be inadequate where sequential resolution of numerous single point-like objects is desired. STEM throughput may be inadequate, for example, for sequencing a full human genome in a practical amount of time.

Transmission electron microscopy (TEM), unlike STEM, images the specimen in parallel. But TEM imaging can be problematic when trying to resolve single point-like objects because the phase-contrast information is typically not directly interpretable for this purpose. For example, a light area in a TEM image could represent either an atom or the absence of an atom. Accordingly, although TEM may have good throughput, it does not typically yield the desired information about the specimen.

Thus, it is desirable to have electron microscopy that can reliably resolve point-like objects. It is further desirable for such electron microscopy to have substantially high throughput. Moreover, it is desirable for such electron microscopy to be provided at an affordable cost.

SUMMARY

In one embodiment, a transmission electron microscope comprises an electron beam source to generate an electron beam. Beam optics are provided to converge the electron beam. The microscope further comprises a specimen holder to hold a specimen in the path of the electron beam. A detector is provided to detect the electron beam transmitted through the specimen. The transmission electron microscope of this embodiment is adapted to generate two or more images that are substantially incoherently related to one another, store the images, and combine amplitude signals at corresponding pixels of the respective images to improve a signal-to-noise ratio.

In another embodiment, a method of generating an image of a specimen comprises generating an electron beam and converging the electron beam. A specimen is held in the path of the electron beam. The electron beam transmitted through the specimen is detected to generate two or more images that are substantially incoherently related to one another, the two or more images are stored, and amplitude signals at corresponding pixels of the respective images are combined to improve a signal-to-noise ratio.

In yet another embodiment, a transmission electron microscope comprises an electron beam source to generate an electron beam. Beam optics are provided to converge the electron beam. The microscope further comprises a specimen holder to hold a specimen in the path of the electron beam. A detector is provided to detect the electron beam transmitted through the specimen. The transmission electron microscope of this embodiment is adapted to operate the specimen holder to move the specimen in relation to the beam optics during exposure or between exposures to operate the transmission electron microscope in an incoherent mode.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments and aspects of the transmission electron microscopes described herein and, together with the description, serve to explain the principles of the invention.

DETAILED DESCRIPTION

Figure 1:
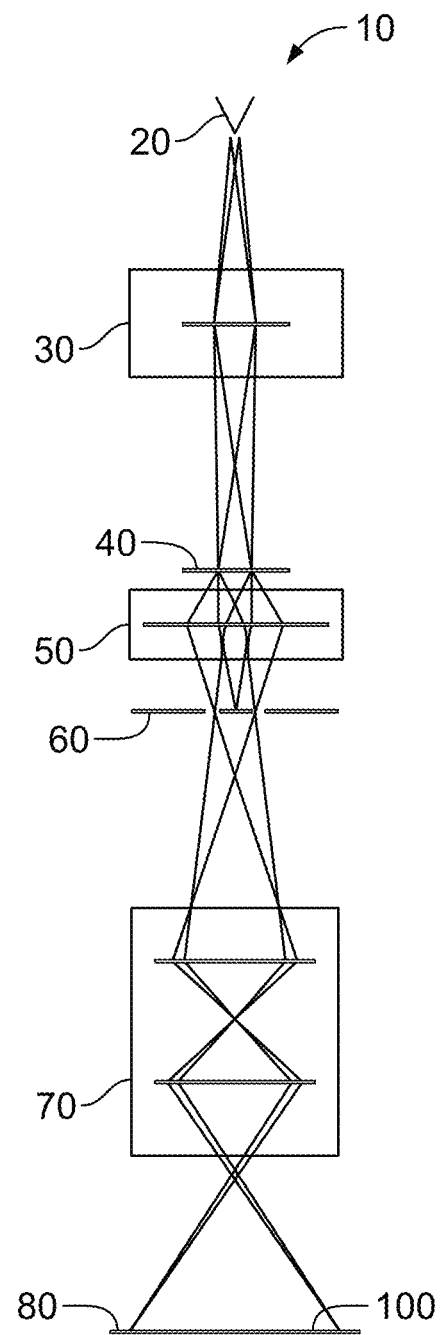
FIG. 1 is a schematic diagram of an exemplary embodiment of an aberration-correcting ADF-TEM column.

A transmission electron microscope (TEM) is able to image a specimen in parallel, thereby theoretically offering rapid and efficient throughput. As explained above, however, TEM imaging can be problematic when trying to resolve single point-like objects because the phase-contrast information in the image is typically not directly interpretable for this purpose. This problem may arise, for example, when trying to image single atoms or clusters of atoms in aperiodic arrangements on a specimen.

The TEM may be adapted to operate in an incoherent illumination mode. In this mode, the coherence of illumination of the TEM is either substantially mitigated or eliminated completely. Incoherence means that different sets of electrons impinging on the specimen are incoherent in relation to one another. In one embodiment, the TEM is implemented with a substantially incoherent electron source. For example, the electron beam source may be adapted to generate an electron beam having an energy spread of less than about 1 eV. Alternatively or in addition, the TEM may produce electron beams that are incoherent in relation to one another at different times. For example, the TEM may differently shift or scan the electron beam over time. In yet another example, the TEM spreads the energy of the electrons in the beam over different predefined ranges of energies over time.

By using incoherent illumination, the contrast between single heavy atoms or clusters of atoms and a relatively light atom substrate of the specimen can be improved while, simultaneously, more current can potentially be directed onto the sample. Incoherent sources can often achieve higher current in exchange for coherence. The contrast improvement arises from the fact that the contrast due to the heavy atom does not depend on interference of a coherent electron wave whereas the details of speckle contrast from the specimen do. Each electron wave that contributes to the image will therefore add intensity at the heavy atom position but average out intensity in the speckle contrast. This improvement may be particularly suited for a system that needs higher data throughput and less expensive electron sources. In other words, the incoherent illumination mode may enable higher throughput, less expensive sources, and better contrast.

The incoherence provides a contrast mechanism that allows direct interpretability of the resulting images. Under incoherent illumination conditions, phase contrast is reduced whereas amplitude contrast is increased by the mechanism of superposition: the randomness of image features in phase contrast signals interferes destructively whereas the scattering from point-like objects interferes constructively. In the aggregate, the scattering information from the point-like objects is retained while the phase contrast information from the amorphous substrate is intentionally washed out. Incoherent illumination may also increase microscope throughput, at least in part due to an increased electron dose from incoherent illumination as compared with coherent illumination.

TEM imaging may be adapted to operate in a "bright field" mode in which a central beam (referred to as a "zero beam") of electrons in the electron beam of the microscope is transmitted through the TEM column. Alternatively, TEM imaging may be adapted to operate in a "dark field" mode in which the central beam is blocked. Indeed, the dark-field mode may be implemented as a primary or dedicated image mode for the TEM. The dark-field mode can produce an image with monotonic contrast change with increasing atomic number, which allows direct interpretability of the image to determine relative atomic weights. For example, dark-field imaging can be used to obtain chemically sensitive projections of single atoms, clusters of atoms, or nanostructures. However, the dark-field mode may decrease the data throughput of imaging due to reduced electron dose, which taken alone may be undesirable. Thus, dark-field imaging techniques based on coherent illumination and suffering from spherical or other aberration may be undesirably slow compared to incoherent illumination.

In order to improve speed, TEM imaging may be adapted to correct for aberrations. Aberrations can be detected and a computer can be used to analyze the aberrations and apply compensating signals to aberration-producing lens elements. The aberration correction can provide increased throughput of imaging. Such increased throughput may be especially advantageous in using TEM for DNA sequencing. The high throughput may allow the microscope to be used in sequencing a full human genome substantially quickly. For example, the microscope may be adapted to sequence a full human genome in from about 200 hours to about 0.01 minutes, such as about 20 hours. In an especially high-throughput version, the microscope may be used in sequencing a full human genome in from about 10 hours to about 1 minute. The term "DNA," as used herein, includes for convenience a wide range of relevant specimens, including oligonucleotides and polynucleotides, and to DNA or RNA of genomic, recombinant, or synthetic origin, which may be single- or double-stranded, and represent the sense or antisense strands, or to any DNA-like or RNA-like material or other polymers, such as proteins, natural, recombinant, or synthetic in origin, and which may contain any nucleic acid, including variants such as 5-Metyl Cytosine and other epigenetically modified bases, artificially modified bases, and individual amino acids, both natural and artificial.

In one version, aberration correction is implemented in a TEM that is adapted to operate in the dark-field mode. As described in copending U.S. patent application Ser. No. 13/024,961 to Own et al., titled "Aberration-Correcting Dark-Field Electron Microscopy" and hereby incorporated by reference in its entirety, a combination of aberration correction and dark-field mode may be especially advantageous when the aberration correction is implemented wholly or in part using "charge-on-axis" elements. "Charge-on-axis" refers to one or more elements placed approximately at the zero beam of the microscope. In a bright-field mode, in contrast, the zero beam would not be blocked by any such elements.

Reference will now be made in detail to exemplary embodiments of TEMs, which are illustrated in the accompanying drawings. Wherever possible, the same reference numbers will be used throughout the drawings to refer to the same or similar parts.

In an exemplary embodiment of a TEM, an electron gun together with condenser lenses and a pre-field of an objective lens form a patch of electron illumination on a specimen. The atoms of the specimen scatter the incident electrons, with the heavier atoms scattering the electrons to higher angles. The post-sample field of the objective lens creates a diffraction pattern in a back-focal plane of the objective lens.

In one version of an approximately cylindrically symmetric system, the TEM may have an annular aperture. In this case, an aperture containing a central beam stop may be mounted in or near the back-focal plane (or a plane conjugate to it). The central beam stop may have the shape of a circular disc. The beam stop limits the scattered electrons to an angular range denoted here as $\phi_d$, which defines an annulus between an inner angle $\phi_1$ and outer angle $\phi_2$. These angles may be, for example, in the case of imaging clusters of atoms, from about 0.1 mrad to about 10 mrad for $\phi_1$, and from about 1 mrad to about 20 mrad for $\phi_2$. In the case of imaging single atoms, these angles may be, for example, from about 5 mrad to about 20 mrad for $\phi_1$, and at least about 20 mrad for $\phi_2$. An example of a suitable range for $\phi_2$ is from about 20 mrad to about 50 mrad. Thus, an example of a suitable range for $\phi_d$ for imaging single atoms may be from about 15 mrad to about 50 mrad. Electrons passing through this annular aperture are ultimately collected on a detector, generating an image of the specimen. In other words, the rays passing through the annular aperture are ultimately the source of the information gleaned from the specimen. At higher angles less intensity may be received at the detector, since the image intensity may drop off approximately with $r^2$, where r is the distance in image plane 100 from optic axis 130.

Alternatively to a cylindrically symmetric system, the central beam stop may have a non-circular shape. For example, the central beam stop may have the shape of a square, hexagon, or another polygon. The inner edge of the aperture may also have a non-circular shape. Thus, the annular opening may have non-circular edges. Such a non-circular annular opening may result in less contrast than a circular annular opening.

An exemplary embodiment of the structural configuration of a TEM is described below. This example of the TEM has an electron optical column that includes an electron source, condenser lenses, a specimen holder, an objective lens, and a detector. In certain embodiments of the TEM, the electron source may be a thermionic source, such as a tungsten (W) or lanthanum hexaboride ($LaB_6$) source. These sources may provide a substantially large current, which may be advantageous in allowing shorter exposures for each image and hence higher throughput. These examples of electron sources may also provide substantially incoherent illumination, as explained in more detail below.

The electron source may be followed by condenser lenses to form a beam that will be incident on the sample. The condenser lenses may consist of, for example, two, three, or four lenses. The condenser lenses may be magnetic or electrostatic. The electrons scattered from the specimen are then imaged through an optical system.

The electromagnetic lenses can also include additional correcting elements. Furthermore, there is an opportunity for standard magnifying lenses to be included in the TEM. These magnifying lenses are followed by an electron detector. The electron detector may have one of many forms that are known to one of ordinary skill in the art.

In a dark-field mode, the optical system may accomplish at least two additional functions. First, the optical system may block out the central scattered beam to implement the ADF mode. Second, the optical system may correct aberrations. The combination of these two features can be particularly advantageous. As part of the aberration-correcting system, a charge-inducing component may be positioned at least partially on the optic axis of the ADF-TEM column (or a more conventional multipole-based aberration corrector), either before, in, or after the objective lens in relation to the beam path.

The TEM may also include a system to correct for parasitic aberrations, in contrast to spherical aberrations, whether parasitic aberrations are cylindrically symmetric aberrations or not. Parasitic aberrations may be caused, for example, by the optical elements having been machined in such a way as to be very slightly off-axis or very slightly non-round.

In one example, a standard aberration corrector for a TEM may include a Nion Co. quadrupole-octupole corrector or CEOS Co. sextupole or quadrupole-octupole corrector. An annular aperture may be provided either in the incoming illumination of the sample (such as for a STEM mode of an ADF-TEM) or in the outgoing scattered beam (such as for a dark-field TEM mode).

The aberration-correcting TEM may additionally include a mechanism for diagnosing the aberrations. Conventional approaches for diagnosing aberrations typically assume that a bright-field image is available. One novel method for TEM is to acquire images as a function of illumination tilt and defocus, and to extract the blurring effect of the tilt and defocus. The blurring gives a value for the defocus and astigmatism at a variety of angles. This process can provide sufficient data to numerically compute an aberration function for the imaging system. A sample used for these purposes may contain single atoms or clusters of atoms, or may be another kind of sample made for the purpose of diagnosing aberrations. For example, the sample may be the specimen that is ultimately the subject of interest for study. Alternatively, the sample may be a sample used solely for calibration of the aberration-correcting TEM.

A particularly useful application of the TEM is to analyze a DNA sample in order to determine the sequence of its base pairs. In one version, a single strand of DNA is stretched using techniques that have been described in PCT Publication No. WO 2009/046445 dated Sep. 4, 2009, entitled "Sequencing Nucleic Acid Polymers with Electron Microscopy," and filed as International Application No. PCT/US2008/078986 on Jun. 10, 2008 (this PCT publication is hereby incorporated by reference in its entirety). A particular set of bases has been labeled with a label that contains at least one heavy scatterer, such as a single heavy atom or a cluster of atoms. Examples of such labels include osmium, triosmium, and platinum.

FIG. 1 is a schematic diagram of an exemplary embodiment of an aberration-correcting ADF-TEM column 10. Column 10 has an electron source 20, one or more condenser lenses 30, specimen 40, objective lens 50, annular aperture 60, one or more projecting lenses 70, and detector 80. An aberration corrector may be incorporated in objective lens 50. Image plane 100 is shown in the figure. Electron source 20 and condenser lenses 30 are configured to provide a variety of illumination conditions. For example, electron source 20 and/or condenser lenses 30 may be adapted to provide a high-current, incoherent illumination mode.

TEM column 10 is connected to a power source that provides power to components of column 10, such as electron source 20, lenses 30, 50, and 70, and detector 80, as well as a stage that holds and moves specimen 40. Column 10 may have a total power consumption of less than about 800 W. In a low-power embodiment, such as where column 10 is miniaturized, column 10 may even have a power consumption of less than about 300 W, such as from about 10 W to about 100 W. Electron source 20 may be adapted to generate an electron beam with a current of less than about 100 mA. In an especially low-current version, electron source 20 may even be adapted to generate an electron beam with a current of less than about 10 µA, such as less than about 10 pA.

The features described herein for the aberration-correcting dark-field TEM may be implemented in many different types of microscopes utilizing charged ions or other particle beams. Moreover, the aberration-correcting dark-field TEM may be used in any suitable facility in any desired arrangement, such as networked, direct, or indirect communication arrangements.

Furthermore, the TEM system may include any quantity of components, such as microscopes, machine managers, computer systems, networks, and image stores, that may be in communication with or coupled to each other in any suitable fashion, such as wired or wireless, over a network such as WAN, LAN, or Internet, directly or indirectly coupled, local or remote from each other, via any communications medium, and utilizing any suitable communication protocol or standard.

The embodiments of TEM described herein may be implemented with either electrostatic or magnetic components. For example, for a commercial setting, a relatively small electrostatic version of the TEM may be constructed. The TEM system may include any quantity of electrostatic or magnetic components, such as electron or other particle gun, lenses, dispersion device, stigmator coils, electron detectors, and stages, arranged within or external to the TEM in any suitable fashion. Image stores, files, and folders used by the TEM system may be of any quantity and may be implemented by any storage devices, such as memory, database, or data structures.

The TEM may include a controller. The controller may include any one or more microprocessors, controllers, processing systems and/or circuitry, such as any combination of hardware and/or software modules. For example, the controller may be implemented in any quantity of personal computers, such as IBM-compatible, Apple, Macintosh, Android, or other computer platforms. The controller may also include any commercially available operating system software, such as Windows, OS/2, Unix, or Linux, or any commercially available and/or custom software such as communications software or microscope monitoring software. Furthermore, the controller may include any types of input devices such as a touchpad, keyboard, mouse, microphone, or voice recognition.

The controller software, such as a monitoring module, may be stored on a computer-readable medium such as a magnetic, optical, magneto-optic, or flash medium, floppy diskettes, CD-ROM, DVD, or other memory devices, for use on stand-alone systems or systems connected by a network or other communications medium, and/or may be downloaded, such as in the form of carrier waves, or packets, to systems via a network or other communications medium.

The controller may control operation of the TEM column. Alternatively or in addition, the controller may receive an image from the detector of the TEM to be processed computationally. For example, the controller may process collected particle data and/or process any desired images. The controller may include an image formation unit for this purpose. The image formation unit may be disposed within or external of the TEM column and communicate with the microscope column in any fashion such as directly or indirectly coupled, or communicate via a network.

Moreover, the various functions of the TEM may be distributed in any manner among any quantity such as one or more of hardware and/or software modules or units, computer or processing systems or circuitry, where the computer or processing systems may be disposed locally or remotely of each other and communicate via any suitable communications medium such as LAN, WAN, Intranet, Internet, hardwire, modem connection, or wireless. The software and/or algorithms described above may be modified in any manner that accomplishes the functions described herein.

The TEM may use any number of images of a sample to determine optimal beam parameter settings and/or image quality values. The images may cover any desired variation range for a particular parameter. The sample may be of any quantity, may be of any shape or size, and may include any desired features. For example, the sample may include a specific configuration for a desired application or parameter setting. The sample may be disposed at any desired location on or off the stage to acquire images. In one example, the sample is in the form of a product specimen such as a semiconductor device. Alternatively, the sample may be a test specimen such as gold nano-particles on a carbon film.

The TEM may also use any number of images for the image quality comparison, where the image quality values for current and prior images may be combined in any suitable fashion, such as averaged, weighted, or summed. The user threshold may be set to any suitable values depending upon the desired image quality. The comparison of image quality values may utilize any mathematical or statistical operations to determine image quality compliance such as a comparison, statistical variance, or deviation.

The TEM may analyze any suitable characteristics, such as intensity, pixel counts, or power, each of which may be analyzed in real space or in frequency space (so that intensity may be within or without a spatial frequency range) and utilize any differentiating characteristic between settings in any desired region. The region of separation may be of any shape or size and be located within any desired range. The aberration-correcting dark-field TEM may also utilize any suitable modeling or approximation techniques to determine best fit lines and/or curves such as linear or non-linear regression, curve fitting, least squares, or integration. The models may approximate the data within any suitable tolerances. The TEM may identify any quantity of separation regions and utilize any suitable techniques to combine and/or select resulting slope values such as lowest slope, average, weighting, or sum.

The parameter determination may be triggered in any suitable fashion. For example, the machine manager may monitor the microscope to initiate the determination, the computer system or controller may periodically retrieve images based on a periodic acquisition of sample images or poll the image store to determine the presence of sample images, or manually trigger determination. The quality inspection and/or parameter determination may be initiated in response to any suitable conditions (e.g., within any desired time interval such as within any quantity of hours or minutes, subsequent any quantity of images generated by the microscope such as every Nth scan performed by the microscope, subsequent any quantity of quality inspections.

The TEM imaging technique may be performed automatically, where parameters are determined and applied to the microscope. Alternatively, any part of the technique, such as scanning of images, determination of parameters, or application of the parameters, may be performed manually. For example, the computer system may provide the optimal settings to a technician that manually applies the settings to the microscope. The microscope controller may perform any desired processing, such as monitoring and parameter adjustment or image formation and processing.

Implementation of aspects of the TEM, such as the image processing or aberration correction, may be distributed among the computer system, microscope controller, or other processing device in any desired manner, where these devices may be local or remote in relation to one another. The computer system and microcontroller communicate with and/or control the microscope to perform any desired functions, such as scan the specimen and generate the images or transfer images to memory.

While the incoherent TEM can be built de novo from specifically designed components, there may be practical advantages to modifying conventional EM systems to provide the advantageous characteristics of the inventive systems. For example, such modification may allow existing EM facilities to upgrade their current equipment to obtain the advantages of the incoherent TEM at a desirably low cost without requiring the construction of an entirely new EM system. The modification may include retrofit of new components and realignment or repositioning of existing components, such as of components in the upper column of the EM.

As described herein, incoherent illumination may be generated by, for example, the use of a substantially incoherent electron source or shifting, scanning, or altering the energy of the electron beam.

Figure 2:
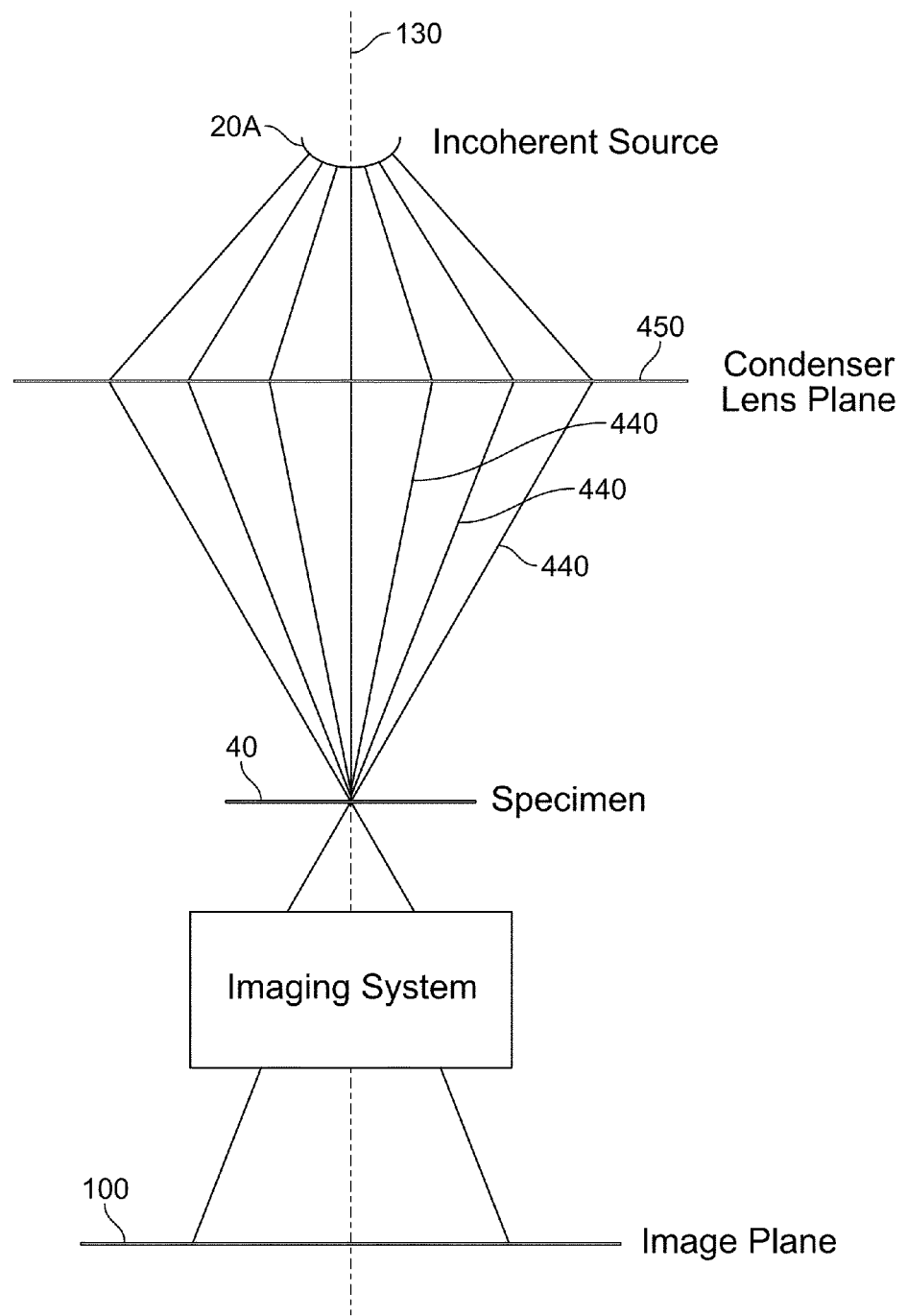
FIG. 2 is a schematic diagram of an exemplary embodiment of an implementation of an incoherent illumination mode using an incoherent electron source.

FIG. 2 illustrates an exemplary embodiment of an implementation of an incoherent illumination mode using an incoherent electron source 20A. The electron beam consists of a filled cone of many different sub-beams that are incoherent in relation to one another, referred to as incoherently related pencils of illumination, and are emitted by electron source 20A. Each of incoherently related pencils 440 is a constituent that is incoherent in relation to the other constituents. A summation of phase contrast that cancels and amplitude signal that reinforces occurs simultaneously at image plane 100, so a usable image can be produced at once. Incoherent electron source 20A may be, for example, an electron source having a tungsten or lanthanum hexaboride filament. Incoherent electron source 20A may be combined with two or more condenser lenses 450, which can be excited in different configurations to allow alignment in a coherent illumination mode and then imaging operation in incoherent illumination mode.

There is an embodiment in which incoherence or the electron beam is enhanced by low demagnification of electron source 20A. The EM column includes condenser lenses 106a-c to demagnify incoming electron beam 104 from electron source 20A. Demagnification may be necessary in order to sufficiently concentrate the current of electron beam 104 on a desirably small region of the specimen. Incoming electron beam 104 may include a range of angles from electron source 20A or a surface area of electron source 20A.

Figure 3A:
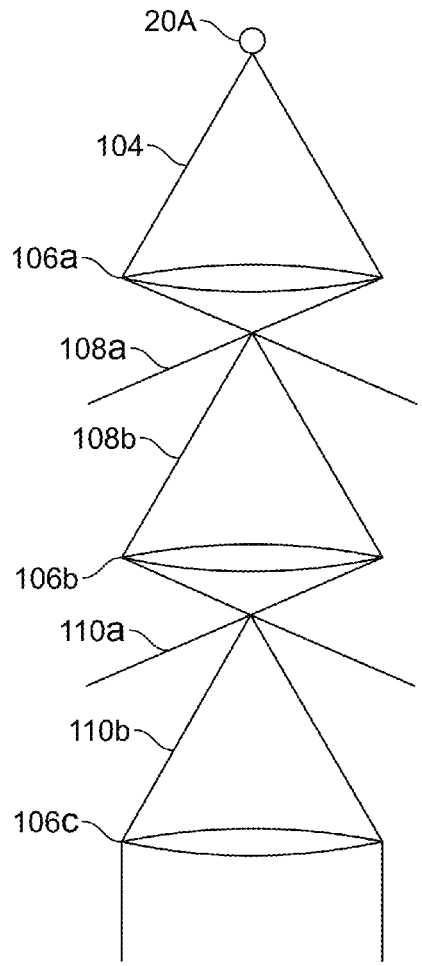
FIGS. 3a and 3b are schematic diagrams of exemplary embodiments of electron beam trajectories through a set of condenser lenses, showing different amounts of demagnification.
Figure 3B:
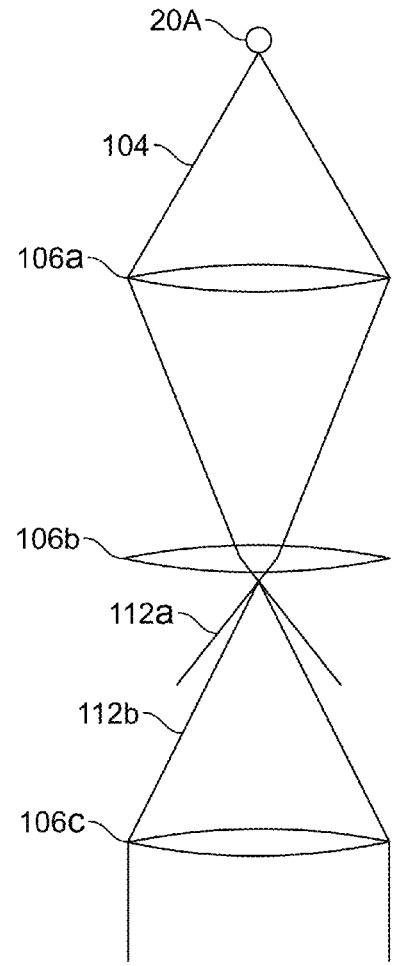

FIGS. 3a and 3b illustrate electron beam trajectories with greater and lesser levels, respectively, of demagnification. In FIG. 3a, condenser lens 106a demagnifies incoming electron beam 104 into an initial beam portion 108a. As shown in the figure, however, only a sub-portion 108b of beam portion 108a is received by next condenser lens 106b. The part of beam portion 108a that lies outside of sub-portion 108b is effectively discarded from the transmitted electron beam. Similarly, condenser lens 106b demagnifies beam portion 108b into a beam portion 110a. Of beam portion 110a, only a sub-portion 110b is received by next lens 106c. Thus, beam portion 110b represents a subset of the range of angles from electron source 20A or surface area of electron source 20A that is contained in initial electron beam 104.

In FIG. 3b, on the other hand, condenser lenses 106a-c do not demagnify incoming electron beam 104 as strongly as in FIG. 3a. As shown in the figure, after condenser lens 106b, part of beam portion 112a is effectively discarded such that only a sub-portion 112b is received by next lens 106c. Thus, beam portion 112b represents a subset of the range of angles from electron source 20A or surface area of electron source 20A that is contained in initial electron beam 104. Since incoming electron beam 104 is less strongly demagnified in FIG. 3b than in FIG. 3a, beam portion 112b in FIG. 3b represents a larger subset of the range of angles from electron source 20A or surface area of electron source 20A that is contained in initial electron beam 104 than does beam portion 110b in FIG. 3a. Accordingly, beam portion 112b in FIG. 3b contains a larger number of incoherently related pencils of illumination.

Alternatively or in addition, the incoherent illumination mode may be implemented in the TEM without an incoherent electron source. For example, the incoherent illumination mode may be implemented by generating electron beams that are incoherent in relation to one another at different times. This may be preferable where a conventional EM system designed for coherent-mode operation is being modified into one of the incoherent-mode embodiments described herein.

During exposure of the image, either the angle, the position, or the energy of the source may be altered. These changes may be made on the time scale of the exposure. In an illustrative example, if the image is a one-second exposure, any combination of the energy, position, and angle can be oscillated, such as, for example, on the order of about 10 times the exposure time. If the energy is scanned, chromatic aberration can be compensated for by simultaneously scanning the focus of the beam. With an incoherent illumination mode, a much higher beam current can typically be achieved on the specimen than with coherent illumination, and therefore imaging may take place much faster. More typically, the exposure time would be, rather than one second, on the order of milliseconds or microseconds. An advantage of incoherent illumination mode, particularly for the application of DNA sequencing (or any application involving identifying single heavy atoms or clusters of atoms on an otherwise low density background), may be an increase in the speed of image acquisition that goes with the increased amount of current that impinges on the specimen.

Either rocking or scanning the electron beam may work as long as the rocking or scanning is sufficiently fast. Furthermore, it may suffice to scan or rock the beam within the angular range that is collected by the aperture of the objective lens. This angular range may be considered a limiting factor since, beyond this angular range, the current impinges on the aperture and does not get detected. However, it may be desirable to scan or rock the beam slightly beyond the angular range that is collected by the aperture of the objective lens, since scattering into the aperture may nevertheless occur. Nevertheless, rocking or scanning the beam across an angular range of more than twice the acceptance angle of the objective lens may not be desirable since it would waste current.

A conventional EM system designed to operate in a coherent illumination mode may be modified into one of the embodiments described herein. This EM system may include an optimized system of condenser lenses, such as two to five condenser lenses. The electron source of the conventional EM system may be replaced with an incoherent electron source, such as one of the incoherent electron sources described herein. In addition, deflectors or other mechanisms may be added for laterally shifting or angularly wobbling the beam, and/or a mechanism may be added to vary the accelerating voltage applied to the beam. Aberration-correcting illumination systems are available from JEOL, FEI, and Zeiss (such as Zeiss's Kohler illumination system). The trajectories of the electron rays through one or more of the lenses of the illumination system may be altered.

The acceptance angles of the objective lens may be determined based on the desired resolution of the microscope. For example, if 1 Ångström resolution at 100 kilovolts is desired, one may need approximately 20 milliradians acceptance half-angle, and therefore one might preferably not go beyond 40 milliradians of illumination half-angle. With a greater angular range, current may undesirably be wasted. In one example, single-atom resolution—namely resolution at least as good as about 0.3 nanometers and in some instances at least as good as about 0.15 nanometers—may be desirable for a DNA-sequencing application. Once a suitable accelerating voltage is chosen, that resolution requirement may determine the acceptance angle of the objective lens.

A conventional EM system whose illumination trajectories have been modified to achieve relatively incoherent illumination can be further improved to take advantage of the higher current enabled by incoherent illumination by increasing the speed of the detector or stage. For example, a piezoelectric stage may be used. The piezoelectric stage may be able to move very quickly and settle very quickly and stably so that short exposures of the order of milliseconds or microseconds can be practically achieved. The piezoelectric stage may also be adapted to move the stage with very high positional precision. Furthermore, the throughput of data that emerges from the detector, which in this case may be a high-speed camera, may be quite large, such that electronics capable of dealing with this data throughput downstream of the camera may be desirable.

Some of the methods of achieving an incoherent illumination mode include taking a number of image constituents that are individually coherent and combining these image constituents incoherently. There are several different ways of generating and incoherently combining these image constituents, as described in more detail below.

Figure 4:
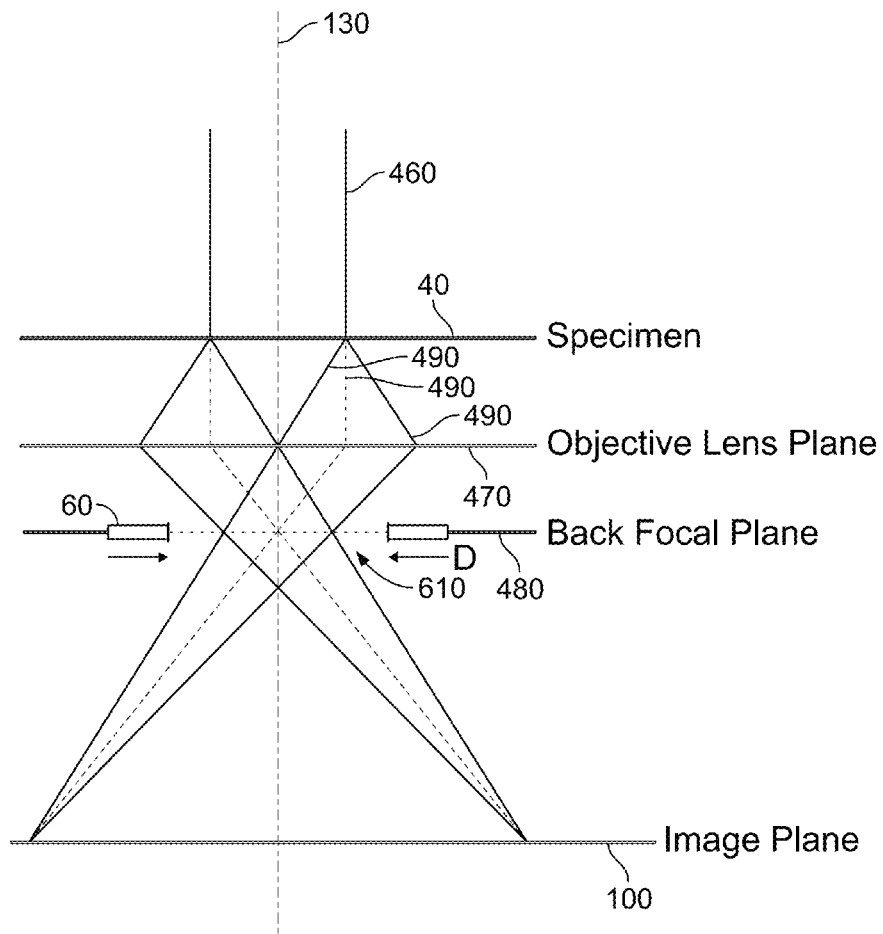
FIG. 4 is a schematic diagram of an exemplary embodiment of a reference version of a TEM.
Figure 4:
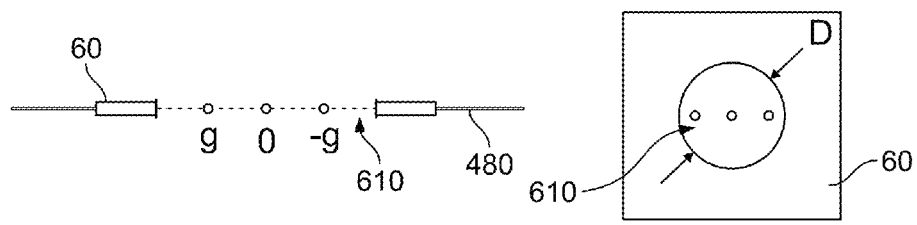

FIG. 4 illustrates an exemplary embodiment of a reference version of a TEM that other exemplary embodiments described below will be compared to for the sake of illustration. Illumination 460 is provided parallel to optic axis 130 and onto specimen 40. Beams scattered from specimen 40 are collected by the objective lens in objective lens plane 470, which focuses the beams onto image plane 100. In back focal plane 480 of the objective lens, a diffraction pattern is formed that is the Fourier transform of the exit waveform of specimen 40, representing angles of scatter from specimen 40. Three scattered beams 490 are shown demonstrating that rays scattered to the same angle by different points on specimen 40 converge to specific points in back focal plane 480 representative of their scattering angle. In projection, the three points correspond to scattering vectors g, 0 (forward-scattered), and −g. The "forward-scattered beam" refers to the zero beam (i.e., the 0 scattering vector) and a small range of angles around the zero beam.

Figure 5:
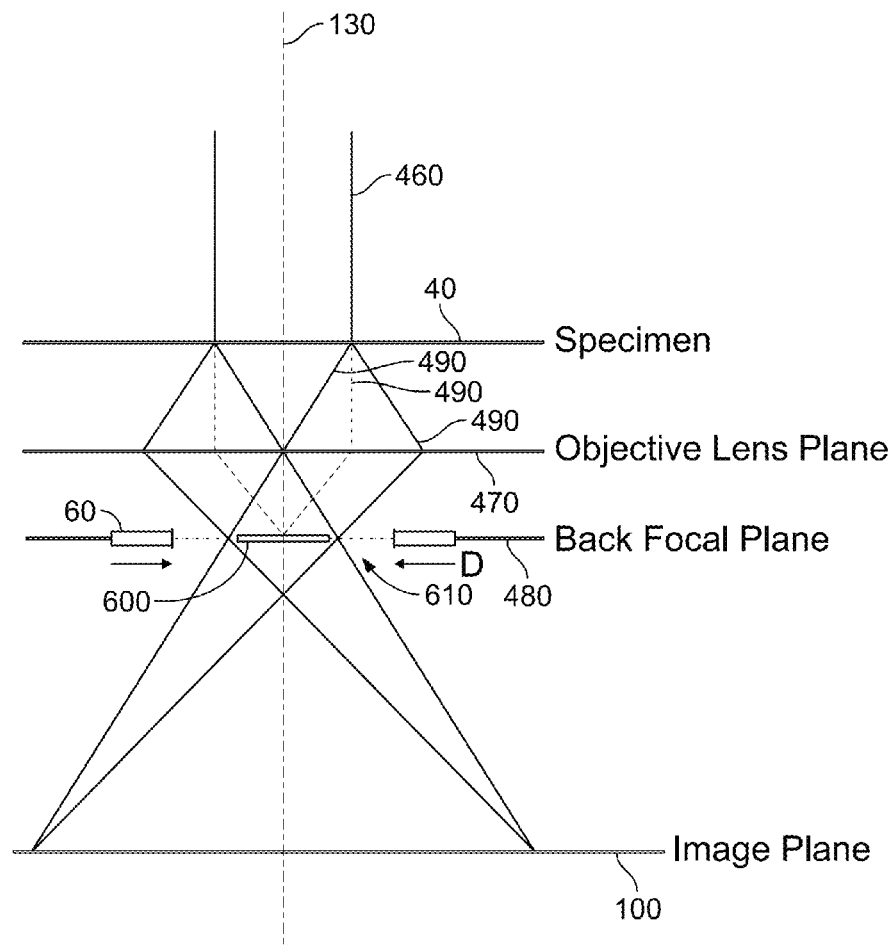
FIG. 5 is a schematic diagram of an exemplary embodiment of a dark-field version of the TEM illustrated in FIG. 4.
Figure 5:

FIG. 5 illustrates an exemplary embodiment of a dark-field version of the TEM illustrated in FIG. 4. In this version, back focal plane 480 contains annular aperture 60, which includes a beam stop 600, a central disc that leaves an opening 610 with outer diameter D for implementing the annular-dark-field mode. While the left and right scattered beams pass through annular aperture 60, the forward-scattered beam (0) is blocked by beam stop 500 in or near back focal plane 480. Only the rays passing through annular aperture 60 propagate to image plane 100, forming a dark-field image.

There is a relationship between the aperture diameter D and resolution. Aperture 60 selects the range of angles that are used to form the image or probe in TEM or STEM, respectively. In the case of TEM, specimen 40 is illuminated and electrons are scattered from different points on specimen 40. The electrons scattered to a particular angle from different parts of specimen 40 are brought to a common point in back focal plane 480, and then propagated further until they form an image. Aperture 60 thus selects the angles which form the image by limiting the rays passing through back focal plane 480. In the case of STEM, where a source produces a plane wave that enters the objective lens, the objective aperture placed in or near back focal plane 480 limits the size of illumination entering the objective lens. The rays that the objective lens focuses to a point on the specimen are thus limited in angle by the aperture.

Figure 6:
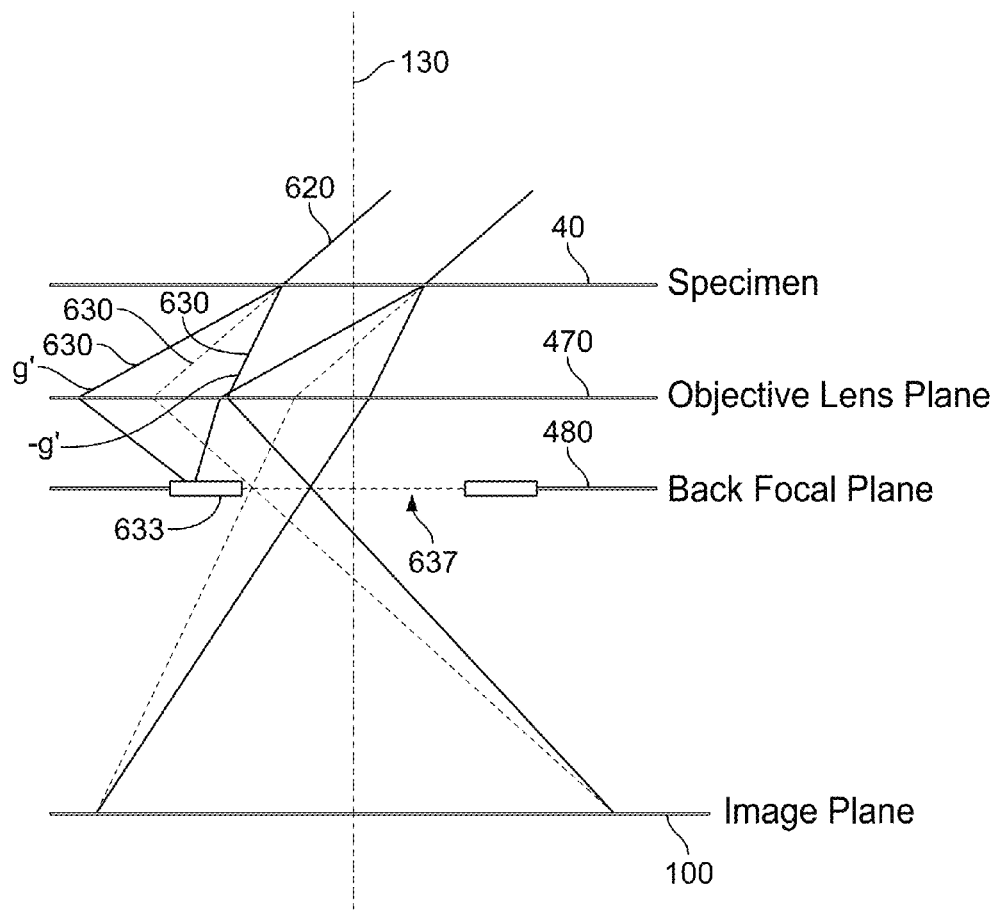
FIG. 6 is a schematic diagram of an exemplary embodiment of an implementation in which image constituents from a tilted and scanned electron beam are summed.
Figure 6:
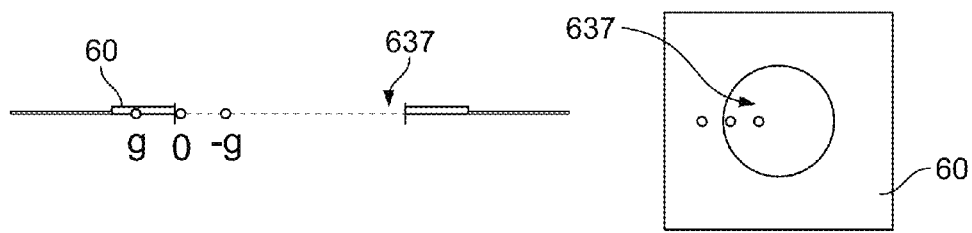

FIG. 6 is a schematic diagram of an exemplary embodiment of a bright-field implementation in which an electron beam 620 is tilted at an angle in relation to optic axis 130 of the EM column. Electron beam 620 may be scanned radially such that electron beam 620 keeps substantially the same angle in relation to optic axis 130, forming a substantially cylindrically symmetric cone of electron illumination about optic axis 130. Alternatively, the angle of tilted electron beam 620 may be flipped between two angles that are symmetric (or "minor" angles) with respect to optic axis 130, the figure showing an example of one of the two mirror angles. For example, electron beam 620 may be passed through a tilting prism that is used to alternately flip electron beam 620 between these two minor angles. Specimen 40 scatters the incident electrons, resulting in scattered beams 630, shown in the figure as two beams on the sides and the one beam in the middle. Scattered beams 630 are focused by the objective lens to the image plane. Scattered beams 630 create a diffraction pattern in back focal plane 480 and are filtered by aperture 633 with a circular disc opening 637. Image constituents from different scan positions of electron beam 620 are summed. These image constituents are incoherent in relation to one another. By illuminating specimen 40 through a cone of illumination, or alternately illuminating specimen 40 at mirror angles, and collecting these image contributions on image plane 100 over time, an incoherently-summed image can be produced. The tilt angle may be less than about 100 milliradians in relation to optic axis 130 and may exceed the aperture radius D/2.

Figure 7:
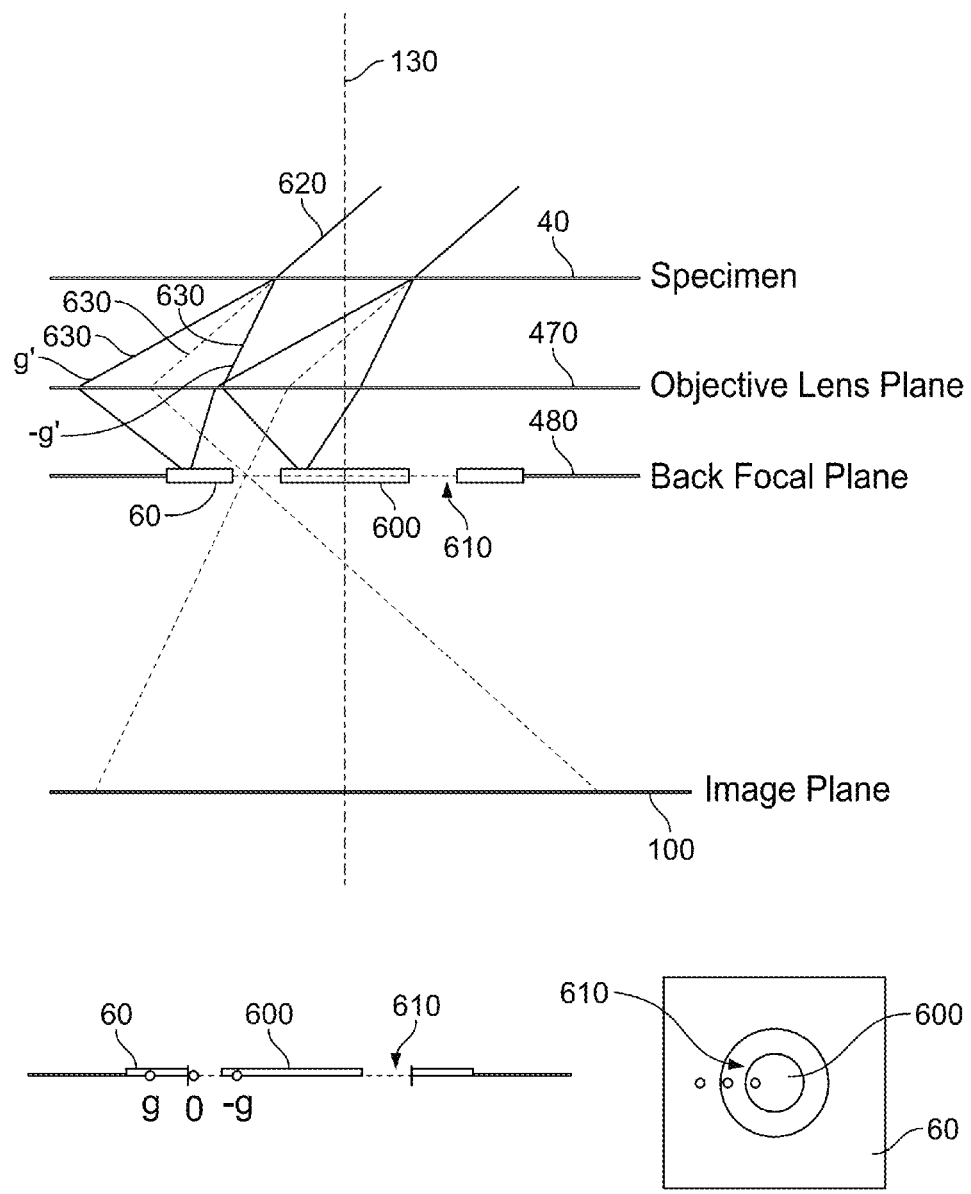
FIG. 7 illustrates an exemplary embodiment of a variation of the TEM illustrated in FIG. 6 with an annular aperture.

FIG. 7 illustrates an exemplary embodiment of a variation of the TEM illustrated in FIG. 6 with an annular aperture. In this variation, back focal plane 480 contains annular aperture 60, which includes a beam stop 600, a central disc that leaves an opening 610 with outer diameter D. While the forward-scattered beam (0) passes through annular aperture 60, the left and right scattered beams are blocked by beam stop 600 in or near back focal plane 480. Only the rays passing through annular aperture 60 propagate to image plane 100, forming a dark-field image.

Figure 8:
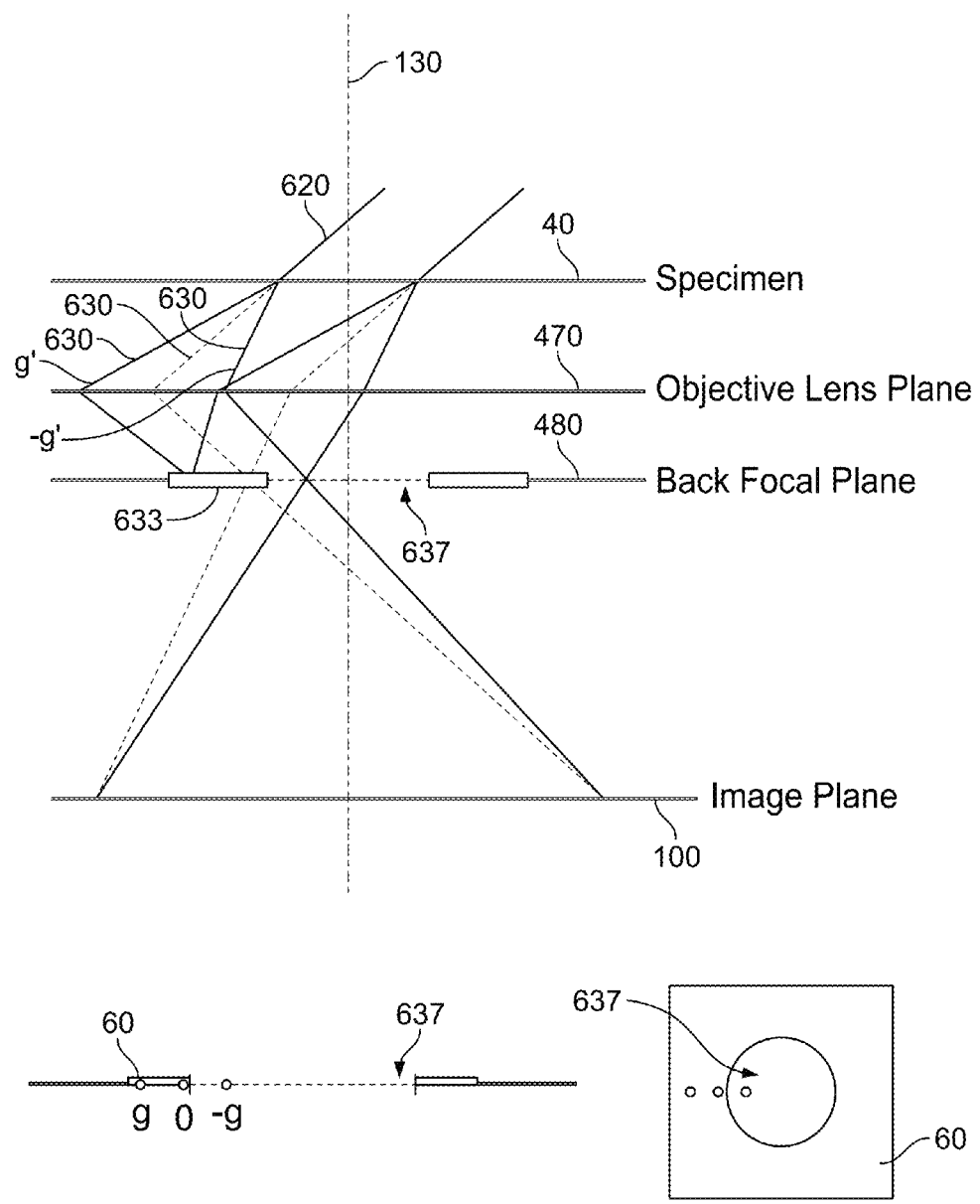
FIG. 8 illustrates an exemplary embodiment of a dark-field variation of the tilted-beam version of FIG. 6.

FIG. 8 illustrates an exemplary embodiment of a dark-field variation of the tilted-beam version of FIG. 6. As shown in the figure, aperture 633 may be adapted, and the tilt angle may be selected, to be sufficiently high to cause the zero beam to impinge on aperture 633 and not pass through opening 637 in or near back focal plane 480. While the right scattered beam pass through aperture 633, the forward-scattered beam and left scattered beam are blocked by aperture 633 in or near back focal plane 480. Only the rays passing through opening 637 propagate to image plane 100, forming a dark-field image. Alternatively, an annular aperture, such as shown in FIGS. 5 and 7, may be used in place of aperture 633 with circular disc opening 637.

The angle of tilt of electron beam 620 may be set to select for scattering angles. These scattering angles, in turn, correspond to different chemical compositions. For example, heavier atoms tend to scatter to a higher angle while lighter atoms scatter to a lower angle. In an exemplary embodiment, the background is carbon, for which relatively low-angle scattering is blocked by aperture 633.

In one version, the aperture is adapted and the tile angle is selected to make the forward-scattered beam impinge mostly on aperture 633, just outside of opening 637, such that the zero beam is blocked by the edge of aperture 633 but neighboring angles pass through opening 637. In this case, a portion of the forward-scattered beam is passed while most is blocked.

Figure 9:
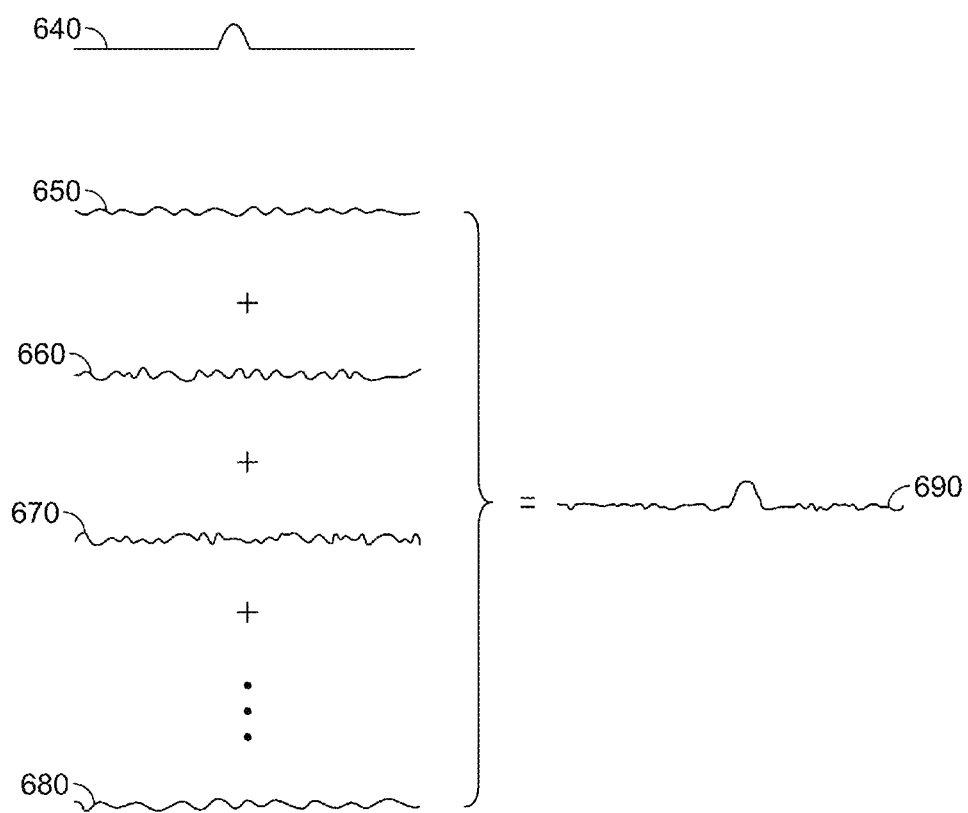
FIG. 9 is a set of plots illustrating a generalized version of the manner in which amplitude contrast is summed while phase contrast is decreased to improve the image of an object being identified in the specimen.

FIG. 9 illustrates a generalized version of the manner in which amplitude contrast is enhanced in incoherent annular-dark-field imaging while phase contrast is decreased to improve contrast of point-like objects in the specimen. This figure shows an ideal amplitude signal 640 from a specimen containing a point-like object on an amorphous background. For the sake of illustration, different incoherently related image constituents, labeled as 650, 660, 670, 680, etc., that are created from the object are shown as vertically arranged. For each of these image constituents, the horizontal axis represents position and the vertical axis represents signal amplitude. Each of the image constituents contains an amplitude contrast component and also a phase contrast component. The latter component dominates in TEM images, as can be seen in image constituents 650, 660, 670, 680, etc. The methods described herein extract amplitude signal 640 from the unwanted phase contrast.

For example, a number of image constituents 650, 660, 670, 680, etc., are taken either in sequence or simultaneously in a particular imaging mode. In each of image constituents 650, 660, 670, 680, etc., the amplitude signal may be small in comparison to the speckle noise from the phase contrast. However, the speckle noise varies substantially between different image constituents 650, 660, 670, 680, etc. Meanwhile, hidden within this noise is a weak yet consistent amplitude signal 640 between different image constituents 650, 660, 670, 680, etc. Thus, when image constituents 650, 660, 670, 680, etc., are superimposed, the phase contrast tends to cancel while amplitude signal 640 constructively interferes, forming an increasingly discernible signal 690 as more incoherently-related constituent images are included.

Figure 10A:
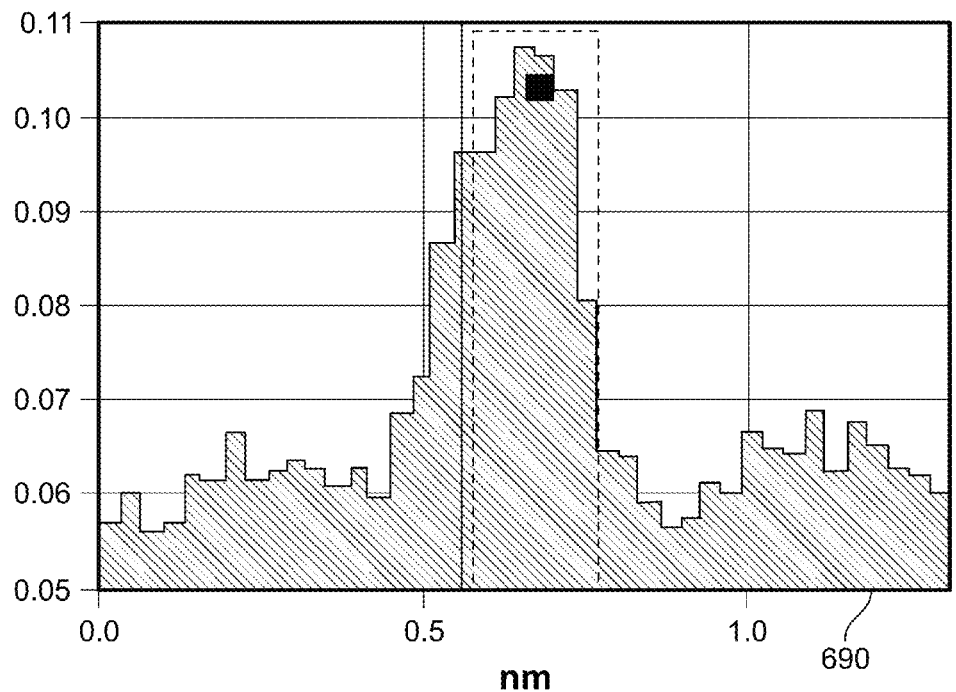
FIGS. 10a and 10b are images and histograms of two examples of amplitude signals received by a transmission electron microscope along a preselected direction.
Figure 10A:
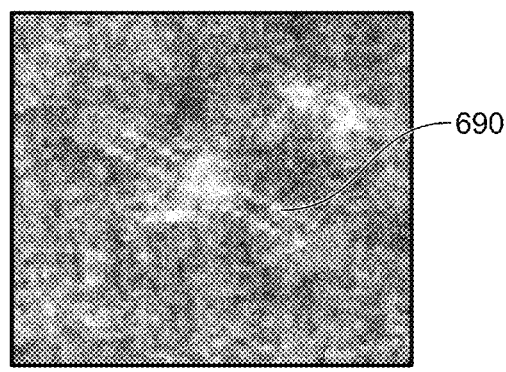
Figure 10B:
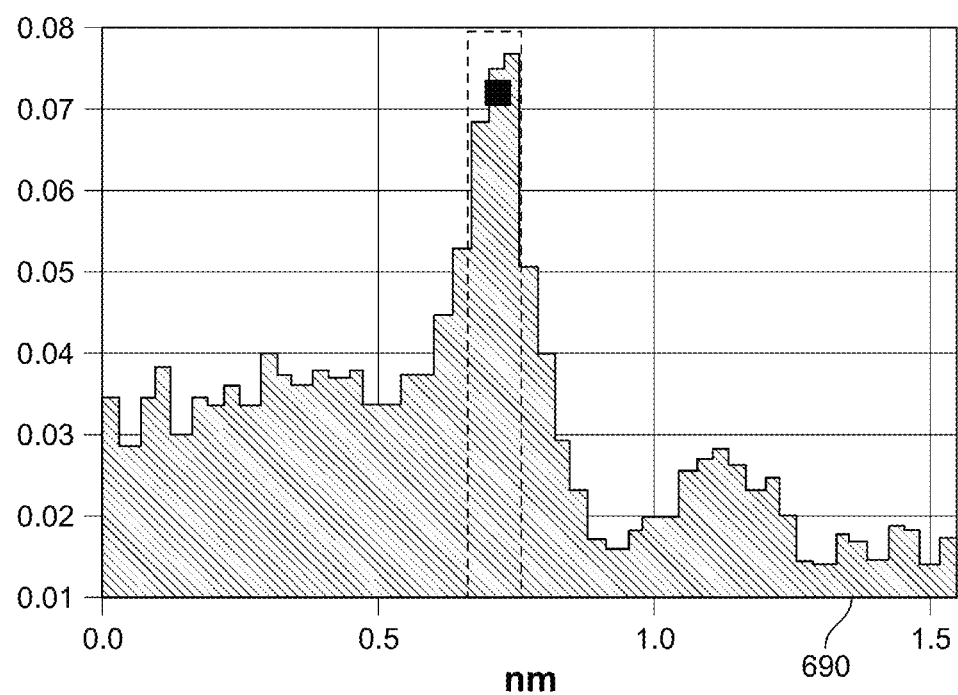
Figure 10B:
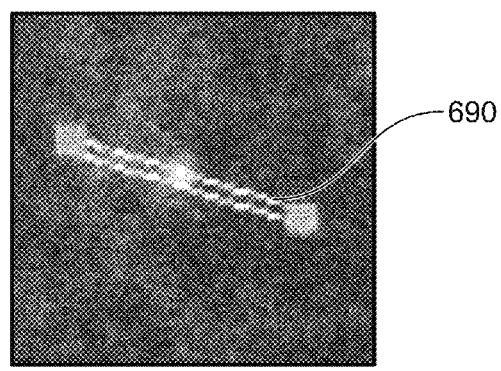

FIGS. 10*a* and 10*b* are images and histograms of two examples, for the sake of illustration, of amplitude signals 690 along a preselected direction. The images at the bottom of the figures are grayscale images of intensity received by the detector of the transmission electron microscope. The histograms at the top of the figures, corresponding to the images below them, respectively, show the same intensity information in a two-dimensional graph. As shown in these examples, an amplitude signal emerges from the noise in the centers of the images and histograms.

Figure 11:
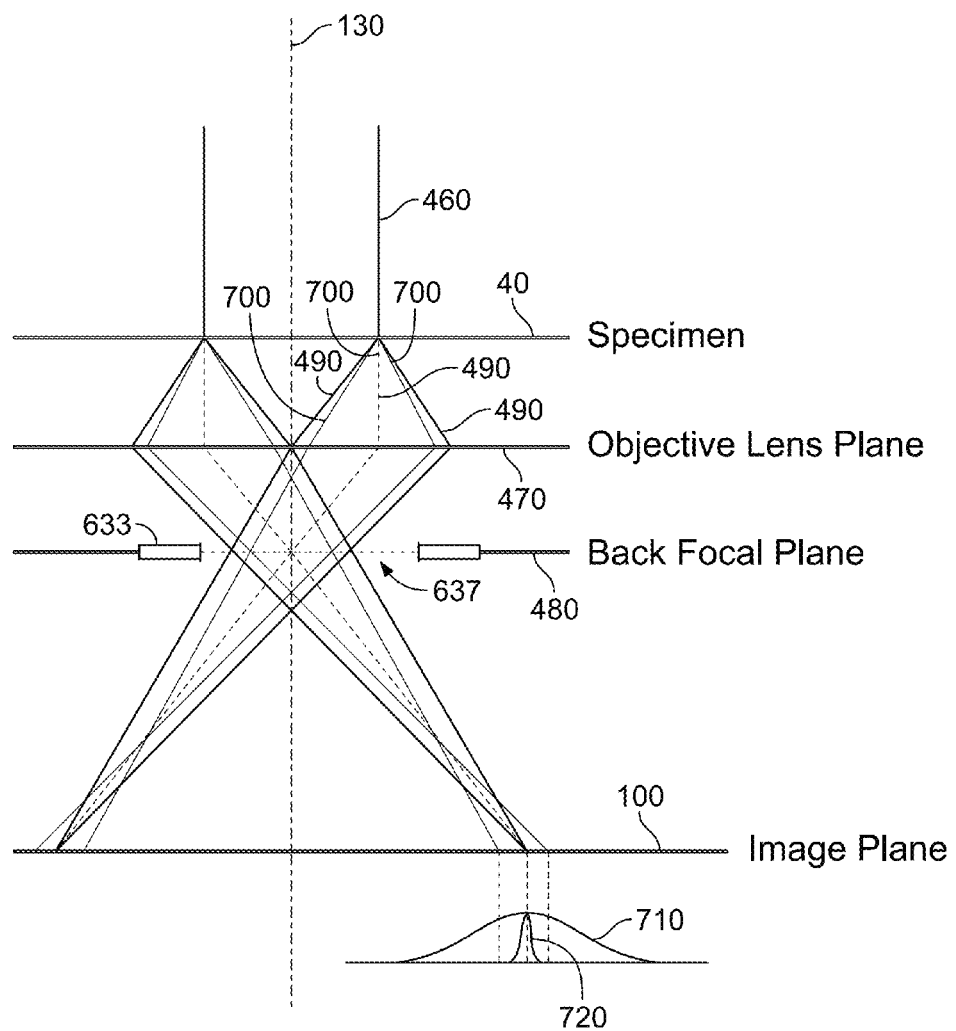
FIGS. 11, 12, 13, 14, 15, 16, and 17 are schematic diagrams of various exemplary embodiments of implementation of incoherent superposition.

FIG. 11 illustrates an example of yet another embodiment of the implementation of incoherent superposition in a bright-field mode. In this figure, different energies are used such that the scattering angles change slightly. Since the objective lens focuses higher energy electrons less strongly than lower energy electrons, the scattering angles from the specimen vary accordingly, as indicated in the figure by scattered beams 490 and 700, representing, respectively, lower and higher energy beams. In this figure, in contrast to FIG. 4, part of the beam that would have been imaged as a point in image plane 100 is now imaged onto a diffuse region 710 and another part of beam 460 that would have been imaged onto a point is now imaged onto a narrower diffuse region 720. While regions 710 and 720 represent diffuse images of the same point of specimen 40, their centers are still approximately in the same location when projected onto image plane 100. A point-like amplitude object, when imaged in this way, will consistently be imaged to the same point. Simultaneously, speckle contrast from the background will be averaged out.

Adjustment of electron energy can be achieved by various alternative methods including, for example, choosing a source with a large energy spread in the electron source, increasing the chromatic aberration in the illumination system, and modulating the voltage applied to the electron source with time at a frequency greater than the exposure frequency.

Figure 12:
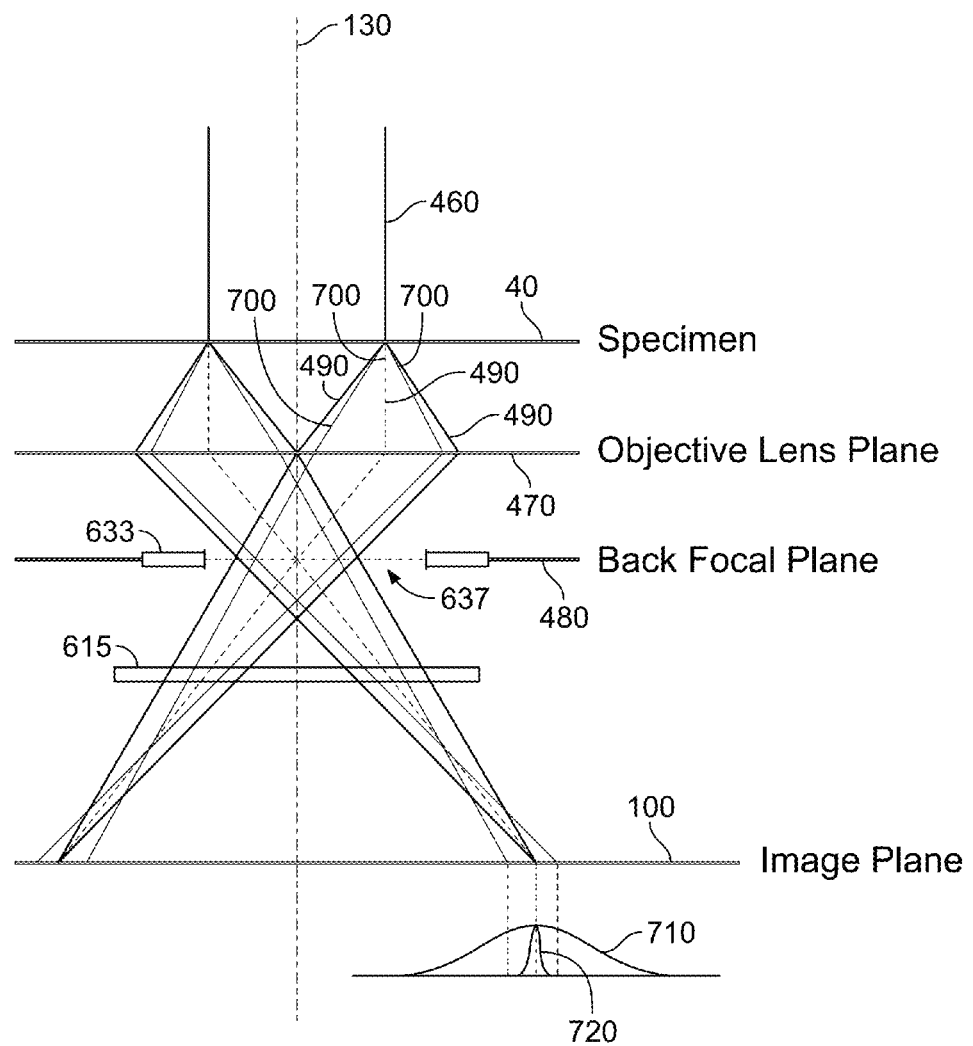

FIG. 12 illustrates an exemplary embodiment of a variation of the spread-energy version of FIG. 11 that is implemented to include chromatic aberration correction. As shown in FIG. 12, a chromatic-aberration corrector 615 is included to correct for chromatic aberrations. Chromatic-aberration corrector 615 may be disposed, for example, below back focal plane 480.

Figure 13:
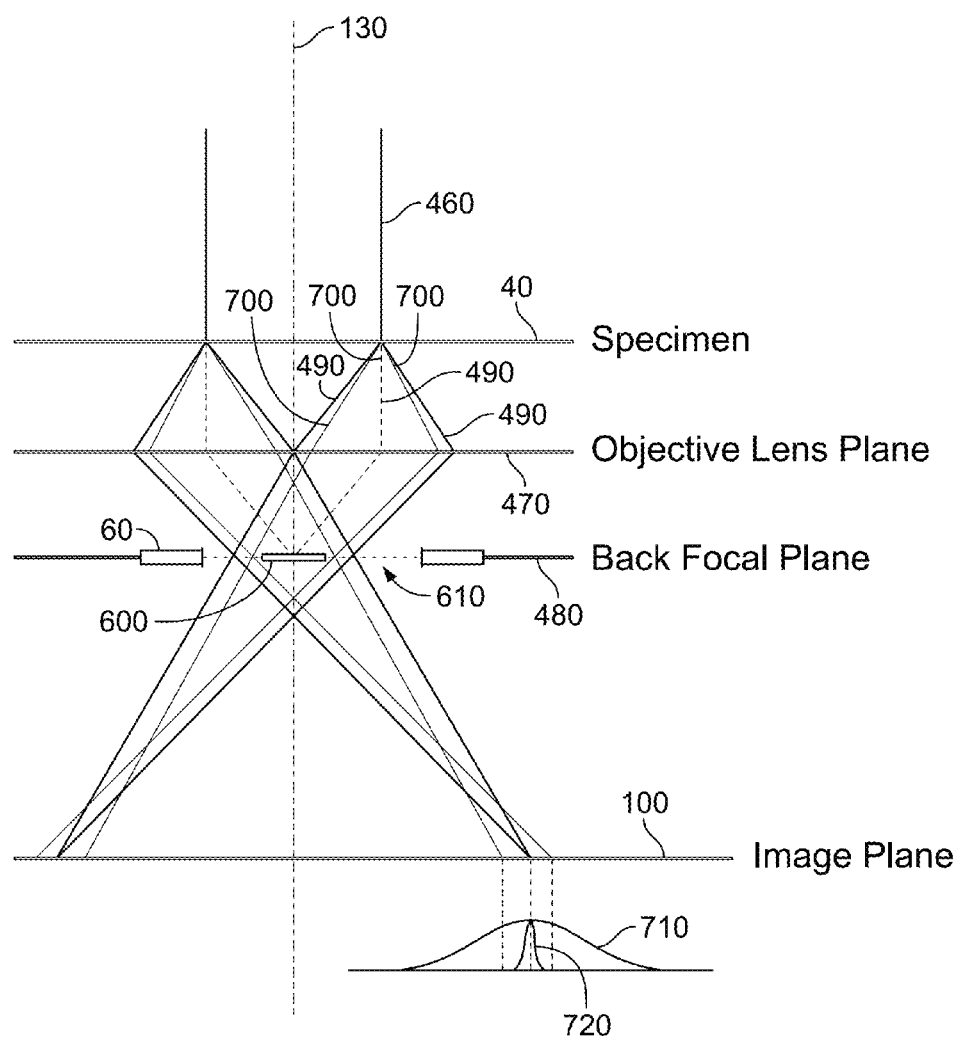

FIG. 13 illustrates an exemplary embodiment of a dark-field variation of the spread-energy version of FIG. 11.

Figure 14:
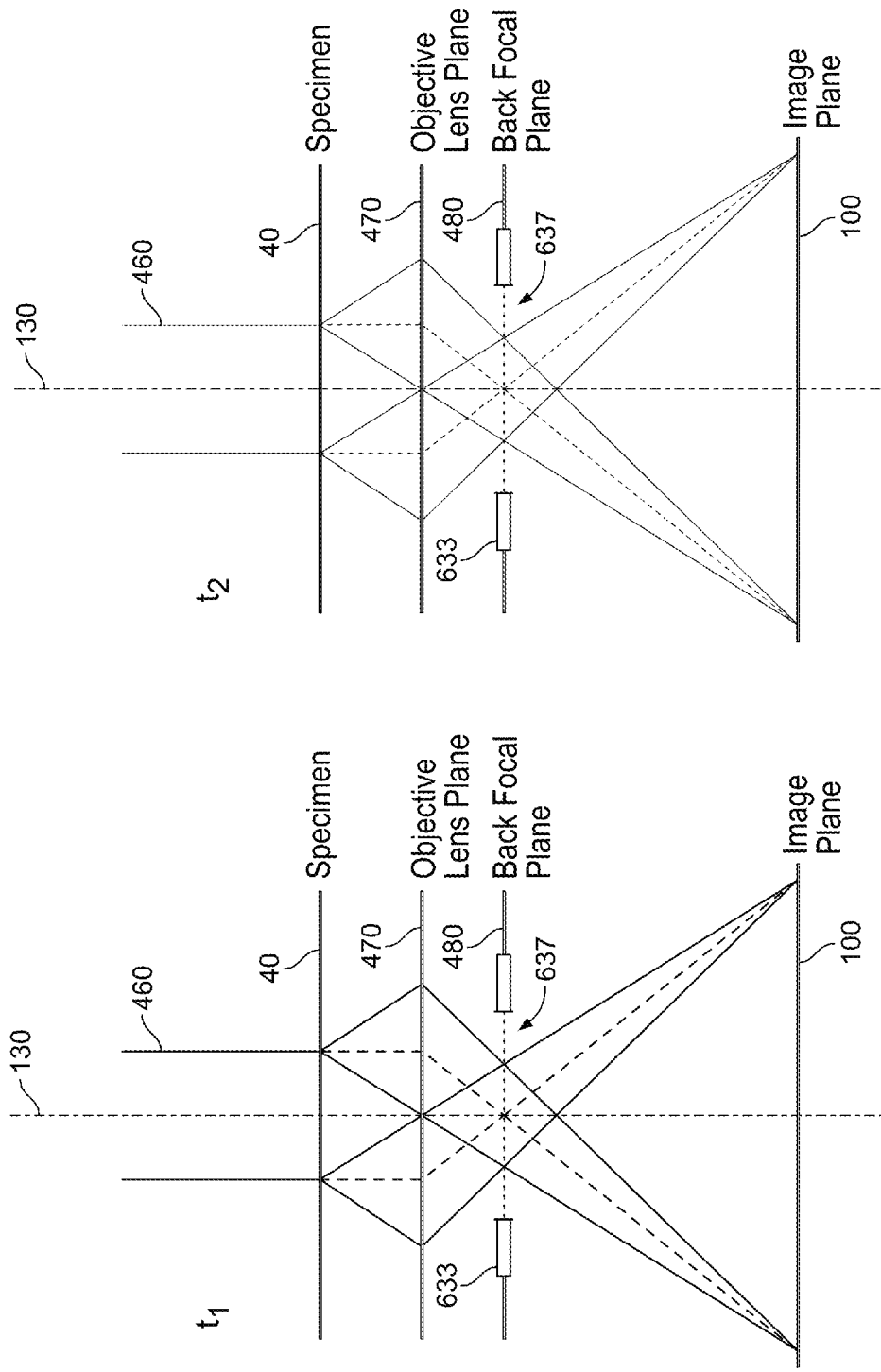

FIG. 14 illustrates an example of yet another embodiment of the implementation of incoherent superposition. In this embodiment, images exposed at different times are summed. Again, through the summation, more amplitude contrast is generated while the phase contrast is decreased. Although FIG. 14 illustrates a bright-field version, this concept may also be implemented in a dark-field mode (not shown).

Figure 15:
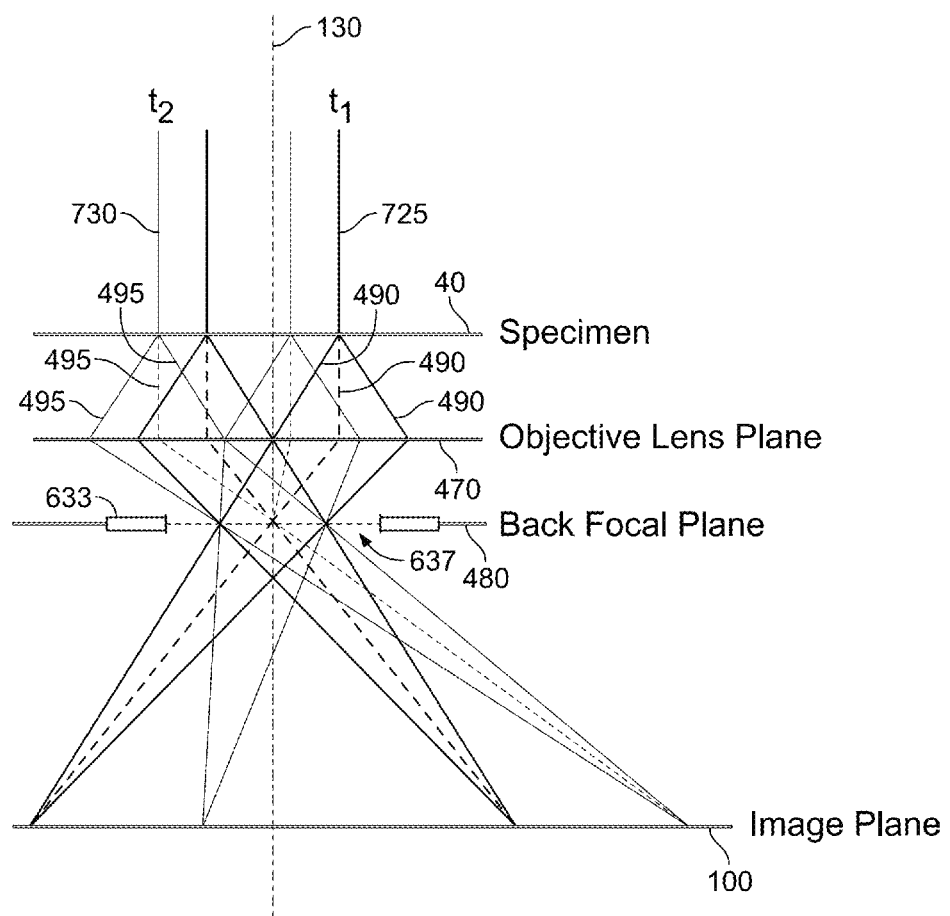

FIG. 15 illustrates still another exemplary embodiment of the implementation of incoherent superposition. In this figure, the electron beam is shifted laterally to different lateral positions, such as position 725 and position 730, at different times to obtain different sets of scattered beams 490 and 495 and the resulting different relatively incoherent constituents. This shift can be achieved in one example by using dipole deflectors to shift the beam before it reaches the sample.

Figure 16:
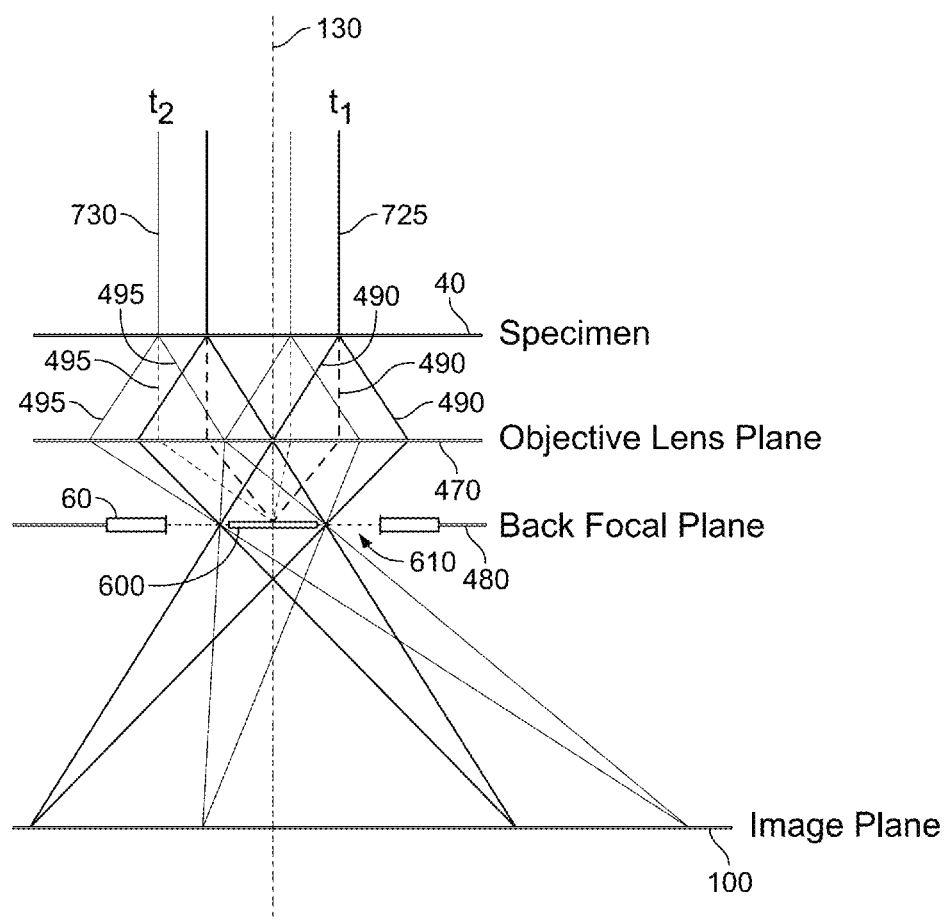

FIG. 16 illustrates an exemplary embodiment of a dark-field variation of the time-shifted version of FIG. 15.

Figure 17:
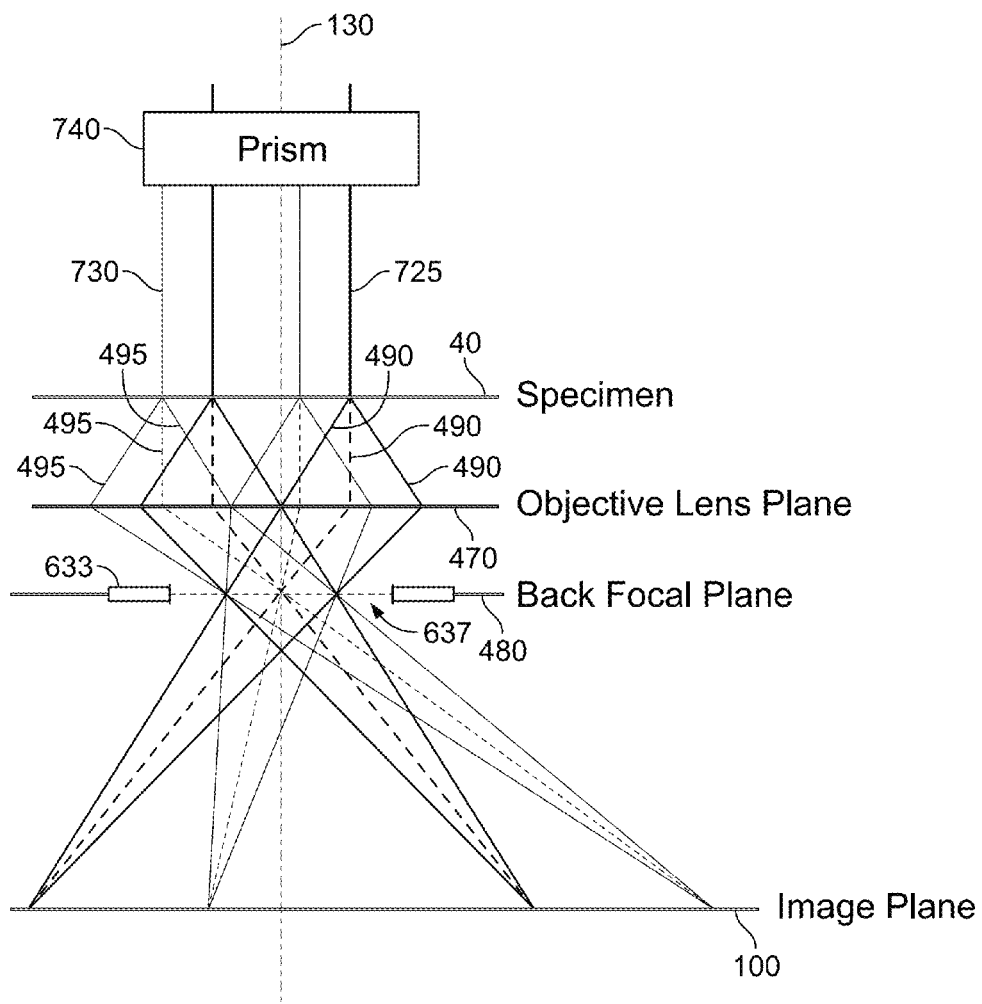

FIG. 17 illustrates yet another bright-field embodiment that is conceptually similar to FIG. 15, but in which a prism 740 is used in the beam path to shift all or a portion of the beam, such as from position 725 to position 730.

The examples shown in FIGS. 6, 7, 8, 11, 12, 13, 14, 15, 16, and 17 illustrate various embodiments in which constituent images are exposed serially or in parallel to improve amplitude contrast relative to phase contrast, thereby improving interpretability of the image.

The electron energy used in the TEM may be determined at least in part based on the transmission properties of the specimen. The specimen may have a thickness on the order of 2 nanometers, such as for example a thickness of about 1 nanometer. In one example, the specimen is made of carbon, although single-atom-thick graphene may also be used. As a result, 1 keV electrons are likely to be the lowest energy appropriate when considering voltage alone.

Unfortunately, since electron wavelength varies inversely with energy, the diffraction limit may require the angles to be corrected to be large. Such an aberration-correcting dark-field TEM may become challenging to manufacture. It may be desirable for the dark-field TEM to be operated at a much higher voltage, such as from about 1 kV to about 300 kV. For example, the dark-field TEM may be operated at about 30 kV. This voltage range is in the realm of conventional microscopy, and the implementation of electrostatic correction elements may be unfeasible in this range due to the risk of damage from high local fields, high voltage discharge, and transmission of high-energy electrons.

For miniaturized embodiments of the aberration-correcting dark-field TEM column, the voltage may be based in part on the dimensions of the miniaturized embodiments. The miniaturization of the column could go even further than described above. Such a miniaturized aberration-correcting dark-field TEM column remains a column with aberration correction by charge-on-axis elements with substantially the same features described herein. A specialized detector may also be useful so that operation of the instrument is in STEM mode or SEM mode, rather than in TEM mode. In that case, a fabricated solid-state backscatter detector may be provided.

The TEM may preferably use a beam current of from about 10 picoamps to about 1 milliamp. When an incoherent illumination mode is intended, the high spatial charge density may desirably increase the incoherence. Thus, for an incoherent illumination mode, a beam current above 100 microamps may be used advantageously.

Furthermore, it may be desirable for the beam to be sufficiently monochromatic, in other words to have a sufficiently narrow range of energies, to avoid focus problems. A spread in energies of the electrons in the beam typically causes a corresponding change of focus of the image. Thus, the image may be thought of as a sum of many images that have changing foci. If that range is too large, then the intensity of a single atom in the image may get blurred out over a large region and thereby become indistinguishable from the background. Thus, it may be preferable to have an energy spread of less than about 10 eV to avoid such blurring. Where a tighter focus is desired, however, it may be preferable to have an energy spread of less than about 1 eV. For example, the electron beam may even have an energy spread of less than about 200 meV. This may be desirable where there is no chromatic aberration correction in the optical system. In other circumstances, however, such as if chromatic-aberration correction is implemented in the optical system, much larger energy spreads may be used. For example, the chromatic-aberration correctors described herein may be able to handle hundreds of electron volts of energy spread.

Although the foregoing embodiments have been described in detail by way of illustration and example for purposes of clarity of understanding, it will be readily apparent to those of ordinary skill in the art in light of the description herein that certain changes and modifications may be made thereto without departing from the spirit or scope of the appended claims. It is also to be understood that the terminology used herein is for the purpose of describing particular aspects only, and is not intended to be limiting, since the scope of the present invention will be limited only by the appended claims.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only," and the like in connection with the recitation of claim elements, or use of a "negative" limitation. As will be apparent to those of ordinary skill in the art upon reading this disclosure, each of the individual aspects described and illustrated herein has discrete components and features which may be readily separated from or combined with the features of any of the other several aspects without departing from the scope or spirit of the disclosure. Any recited method can be carried out in the order of events recited or in any other order which is logically possible. Accordingly, the preceding merely provides illustrative examples. It will be appreciated that those of ordinary skill in the art will be able to devise various arrangements which, although not explicitly described or shown herein, embody the principles of the disclosure and are included within its spirit and scope.

Furthermore, all examples and conditional language recited herein are principally intended to aid the reader in understanding the principles of the invention and the concepts contributed by the inventors to furthering the art, and are to be construed without limitation to such specifically recited examples and conditions. Moreover, all statements herein reciting principles and aspects of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary configurations shown and described herein. Rather, the scope and spirit of present invention is embodied by the claims.

In this specification, various preferred embodiments have been described with reference to the accompanying drawings. It will be evident, however, that various other modifications and changes may be made thereto and additional embodiments may be implemented, without departing from the broader scope of the claims that follow. The specification and drawings are accordingly to be regarded in an illustrative rather than restrictive sense.

We claim:

1. A transmission electron microscope comprising:
an electron beam source to generate an electron beam;
beam optics to converge the electron beam;
a specimen holder to hold a specimen in the path of the electron beam; and
a detector to detect the electron beam transmitted through the specimen,
wherein the transmission electron microscope is adapted to generate two or more images that are substantially incoherently related to one another, store the images, and combine amplitude signals at corresponding pixels of the respective images to improve a signal-to-noise ratio.

2. The transmission electron microscope of claim 1, wherein the transmission electron microscope is adapted to consume less than about 800 W of power.

3. A method of generating an image of a specimen, the method comprising:
generating an electron beam;
converging the electron beam;
holding a specimen in the path of the electron beam;
detecting the electron beam transmitted through the specimen to generate two or more images that are substantially incoherently related to one another;
storing the two or more images; and
combining amplitude signals at corresponding pixels of the respective images to improve a signal-to-noise ratio.

4. The method of claim 3, wherein the method consumes less than about 800 W.

5. A transmission electron microscope comprising:
an electron beam source to generate an electron beam;
beam optics to converge the electron beam;
a specimen holder to hold a specimen in the path of the electron beam; and
a detector to detect the electron beam transmitted through the specimen,
wherein the transmission electron microscope is adapted to operate the specimen holder to move the specimen between two or more exposure times that correspond to a single image to improve a signal-to-noise ratio in an incoherent mode.

6. The transmission electron microscope of claim 5, wherein the transmission electron microscope is adapted to operate the specimen holder to move the specimen during exposure for a single image to improve a signal-to-noise ratio.

7. The transmission electron microscope of claim 5, wherein the transmission electron microscope is adapted to operate the specimen holder to move the specimen between two or more exposure times that correspond to separate images that are to be combined to improve a signal-to-noise ratio.

8. The transmission electron microscope of claim 5, wherein the transmission electron microscope is adapted to have a power consumption of less than about 800 W.

* * * * *